United States Patent [19]
Yen

[11] Patent Number: 5,399,986
[45] Date of Patent: Mar. 21, 1995

[54] ISOLATED MULTI-OUTPUT POWER AMPLIFIER

[76] Inventor: Wailit Yen, 14-B Man Foong Ind. Bldg., 7 7 Cheung Lee St., Chaiwan, Japan

[21] Appl. No.: 170,426

[22] Filed: Dec. 20, 1993

[51] Int. Cl.⁶ ............................................. H03F 3/08
[52] U.S. Cl. ........................................ 330/84; 330/85; 330/124 R; 330/148; 330/295; 381/99; 381/121
[58] Field of Search ............... 330/84, 85, 124 R, 126, 330/148, 295; 381/96, 99, 100, 121

[56] References Cited

U.S. PATENT DOCUMENTS

| | | | |
|---|---|---|---|
| 3,745,477 | 7/1973 | Freeborn | 330/294 X |
| 4,081,759 | 3/1978 | Yen | 330/295 |
| 4,146,845 | 3/1979 | Lunquist | 330/260 X |
| 4,287,491 | 9/1981 | Scholz | 330/14 |
| 4,340,778 | 7/1982 | Cowans et al. | |
| 4,367,442 | 1/1983 | Tanaka et al. | 330/149 |
| 4,786,878 | 11/1988 | Botti | 330/84 |
| 4,991,221 | 2/1991 | Rush | 381/120 |

FOREIGN PATENT DOCUMENTS

| | | | |
|---|---|---|---|
| 3637666 | 5/1988 | Germany | 381/96 |
| 77310 | 5/1983 | Japan | 330/84 |

OTHER PUBLICATIONS

Takahashi et al, "Fully Balanced Bridge Amplifier" J. Audio Eng. Soc., vol 32, No. 6, Jun. 1984, pp. 415–421.

Primary Examiner—James B. Mullins
Attorney, Agent, or Firm—Brumbaugh, Graves, Donohue & Raymond

[57] ABSTRACT

A multi-output power amplifier is disclosed. The amplifier is divided into two stages. A single voltage amplifier is used as an input amplifying stage and several current amplifiers are used as a second amplifying stage. The inputs to the current amplifiers share a common connection to the output of the voltage amplifier and feedback is provided from the current amplifier outputs to the voltage amplifier input.

8 Claims, 5 Drawing Sheets

ISOLATED MULTI-OUTPUT POWER AMPLIFIER

BACKGROUND OF THE INVENTION

The present invention relates generally to an improved power amplifier and, more particularly, to a multi-output power amplifier and to a multi-way speaker system including such amplifier.

A typical power amplifier is shown in FIG. 1. This amplifier consists of two amplifier stages: a voltage amplifier 50 followed by a current amplifier 53, the input of which is connected to the output of the voltage amplifier. A feedback resistor 52 is typically connected between the input of the voltage amplifier 50 and the output of the current amplifier 53 to reduce distortions caused by nonlinearity and/or variations in frequency response in the amplifier.

Power amplifiers of this type are often used to drive multi-way audio speaker systems. Two typical two-way speaker configurations using power amplifiers of the type described hereinabove are shown in FIGS. 2 and 3. The two-way speakers of FIGS. 2 and 3 are comprised of an amplification section (including either one or two amplifiers), a woofer 25 for filtering out high frequencies and emitting the low frequency components of the amplified signal, and a tweeter 30 for filtering out low frequencies and emitting the high frequency components of the amplified signal. The "high" and "low" frequencies can be selected by choosing appropriate values for the components of the woofer and tweeter filters.

FIG. 2 illustrates a "bi-cable" amplification arrangement in which a signal is applied to the input of a single power amplifier 15 and the amplified signal is split between two cables 35, 36 at the amplifier output 28. The signals are then delivered to the woofer 25 and tweeter 30. FIG. 3 illustrates a "bi-amp" amplification arrangement in which a signal is applied at the inputs of two amplifiers 17, 20. The output of one amplifier 17 is connected to the woofer 25 via a cable 35 and the output of the other amplifier 20 is connected to the tweeter 30 via a cable 36. Each of the two prior art arrangements depicted in FIGS. 2 and 3 has serious drawbacks.

In FIG. 2, the connection of more than one speaker component (i.e., a woofer 25 and a tweeter 30) to a single amplifier 15 will often result in undesirable and unpredictable distortions caused by the interaction of the different reactances of the output load, in this case the speaker components. This problem may be avoided by the configuration shown in FIG. 3, which employs multiple power amplifiers to ensure isolation among the speaker components. However, while using a separate power amplifier for each speaker component provides a high degree of isolation, disparate signals will often be delivered to each component due to the inherent differences in "like" electrical components. This is a particularly undesirable feature for high fidelity audio systems. Having a separate amplifier for each speaker component also adds considerable expense to a speaker system.

Thus, there is a need for a multi-output amplifier which sufficiently isolates one output from the other while maintaining relative uniformity among the output signals.

SUMMARY OF THE INVENTION

A multi-output amplifying device is divided into two stages. A single voltage amplifier is used as an input amplifying stage and several current amplifiers are used as a second amplifying stage. The inputs to the current amplifiers share a common connection to the output of the voltage amplifier. A feedback circuit is connected between the outputs of the current amplifiers and the input of the voltage amplifier. This amplification arrangement is particularly well-suited for driving a multi-way audio speaker system since it provides the isolation advantages of using multiple amplifiers while maintaining a greater uniformity among output signals than would ordinarily be expected from multiple amplifier arrangements.

In one embodiment of the invention, the feedback circuit includes a transistor connected between the output of one or more of the current amplifiers and the input of the voltage amplifiers for enhanced isolation between the outputs of the current amplifiers.

According to another embodiment of the invention, the voltage amplifier comprises a differential voltage amplifier stage, an active-load amplification stage at the output of the differential voltage amplifier stage and, if needed for driving the current amplifiers, a buffer stage following the active-load amplification stage.

BRIEF DESCRIPTION OF THE DRAWINGS

Other objects, features and advantages of the invention will become apparent, and its construction and operation better understood, from the following detailed description when read in conjunction with the accompanying drawings, in which.

DETAILED DESCRIPTION OF THE PREFERRED EMBODIMENTS

Figure 4:
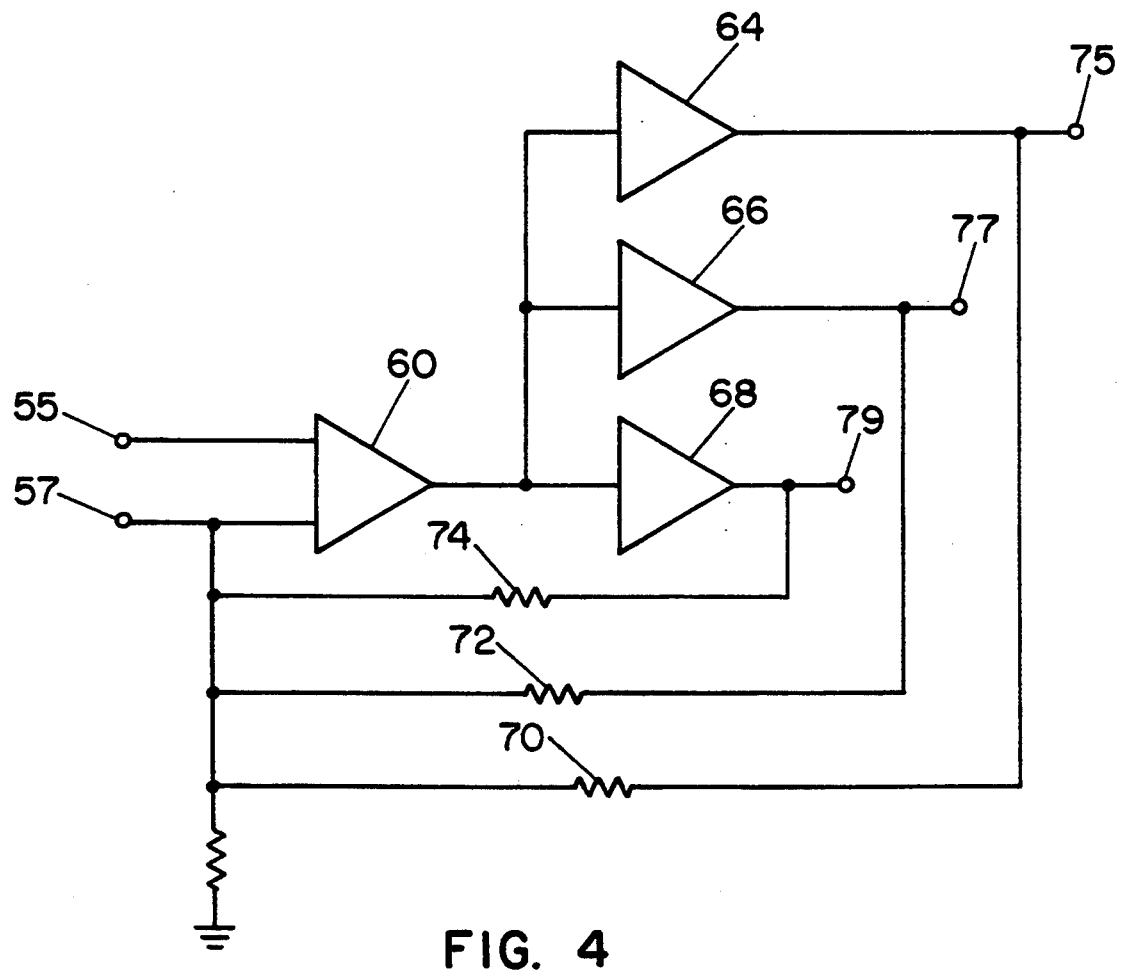
FIG. 4 is a schematic of the basic circuit of the amplifier of the present invention.

FIG. 4 shows a schematic representation of the basic amplifier circuit of the present invention. In operation, a signal for which amplification is desired is applied across the input terminals 55, 57 of voltage amplifier 60. The output of voltage amplifier 60 is in turn connected to the input of three current amplifiers 64, 66, 68. Each output of the current amplifiers 64, 66, 68 has a corresponding feedback resistor 70, 72, 74, respectively, through which the output signals are fed back to input terminal 57 of the voltage amplifier 60. The result is three output signals at output terminals 75, 77, 79 which are isolated from one another and have minimal disparity among them. These properties are especially desirable when driving a multi-way speaker since each speaker should ideally be receiving identical amplified signals.

Figure 5:
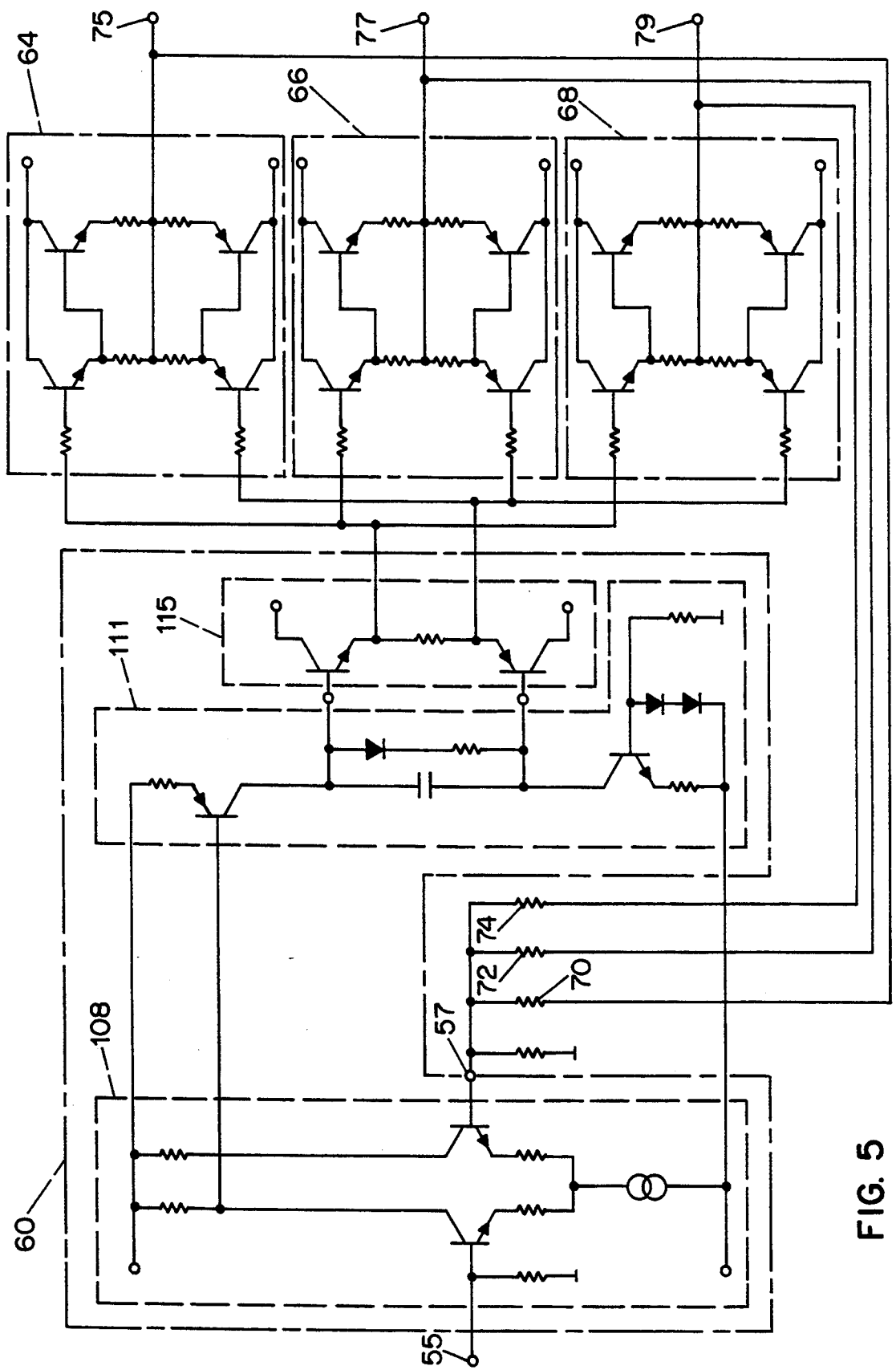
FIG. 5 is a circuit diagram of a first embodiment of the amplifier of the present invention.

FIG. 5 is a detailed circuit diagram of one embodiment of the isolated multi-output power amplifier of FIG. 4. In this embodiment, the voltage amplifier 60 has two stages of amplification 108, [11 and a buffer stage 115. The first stage 108 is a differential voltage amplifier configuration having inputs 55 and 57. The output of the first stage 108 is connected to the second stage 111, an active-load amplification stage, which is followed by the buffer stage 115, a push-pull emitter follower. The buffer stage 115 is included here to ensure that the multiple current amplifiers following the voltage amplifier will be adequately driven. However, if only two current amplifiers are used or if the current amplifiers are low output power current amplifiers, the buffer stage 115 may not be necessary.

The output of the voltage amplifier 60 is connected to multiple current amplifiers. In this embodiment there are three current amplifiers 64, 66, 68, each one a two-stage push-pull current amplifier. Feedback resistors 70, 72, 74 are connected from the current amplifier outputs 75, 77, 79, respectively, to the voltage amplifier input 57.

Figure 6:
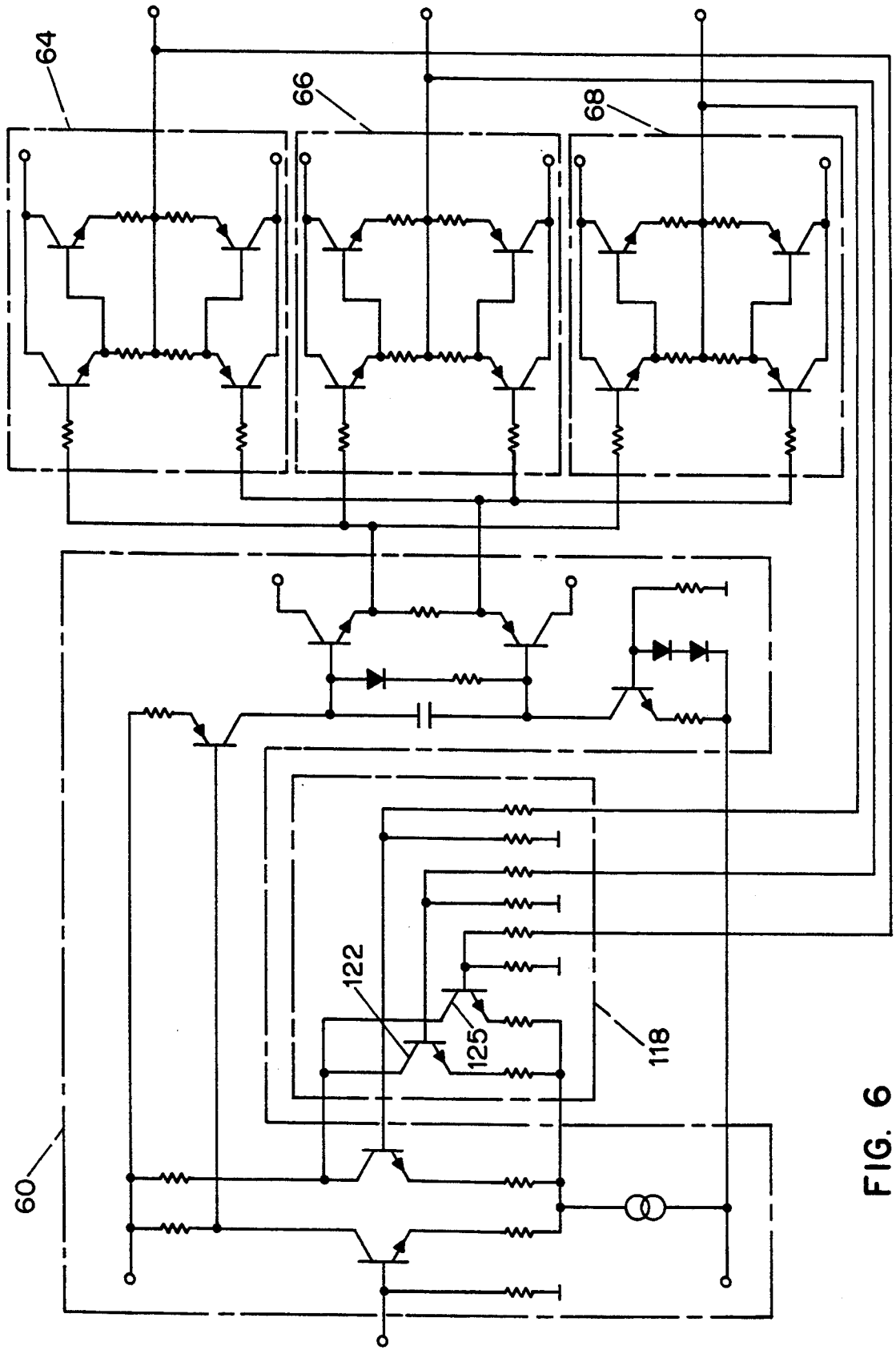
FIG. 6 is a circuit diagram of a second embodiment of the amplifier of the present invention.

A second embodiment of the present invention is shown in FIG. 6. This embodiment contains the voltage amplifier 60 and the three current amplifiers 64, 66, 68 connected to the output of the voltage amplifier 60 which are depicted in FIG. 5. In addition, a feedback circuit 118 comprises resistors as well as feedback transistors 122, 125 between the outputs of current amplifiers 66 and 68 and the input of the voltage amplifier 60. The transistors 122, 125 provide for higher isolation between the outputs of each current amplifier. The higher isolation is desirable when the multiple output amplifier is required to have a lower output gain or higher dc tracking of the output due to loading. It will be appreciated by one skilled in the art that, depending on the environment in which the amplifier is used, a greater or lesser number of feedback transistors than shown in FIG. 6 may be used in the feedback circuit 118.

Figure 1:
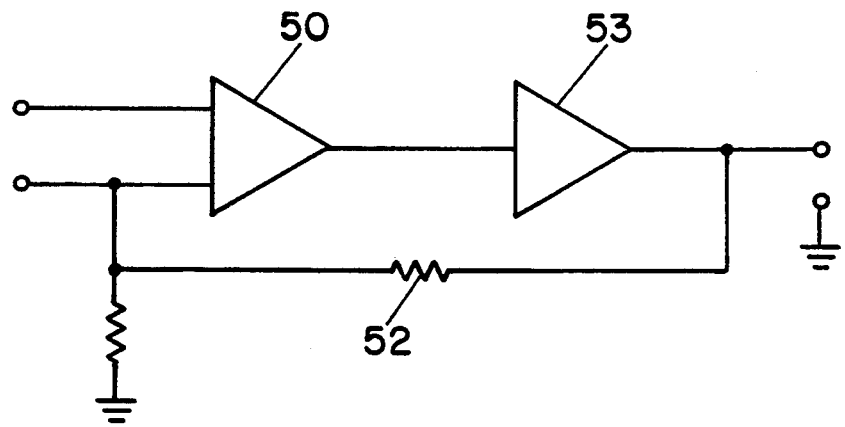
FIG. 1 is a schematic of a typical prior art power amplifier.
Figure 2:
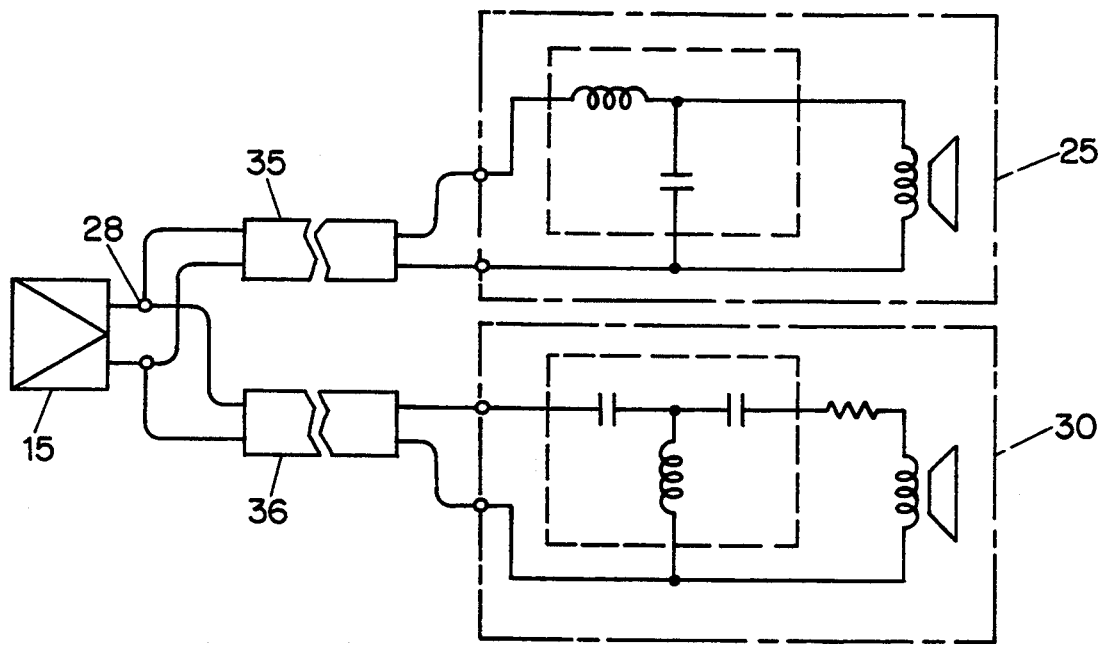
FIG. 2 is a schematic of a first type of prior art multi-way audio speaker amplification arrangement.
Figure 3:
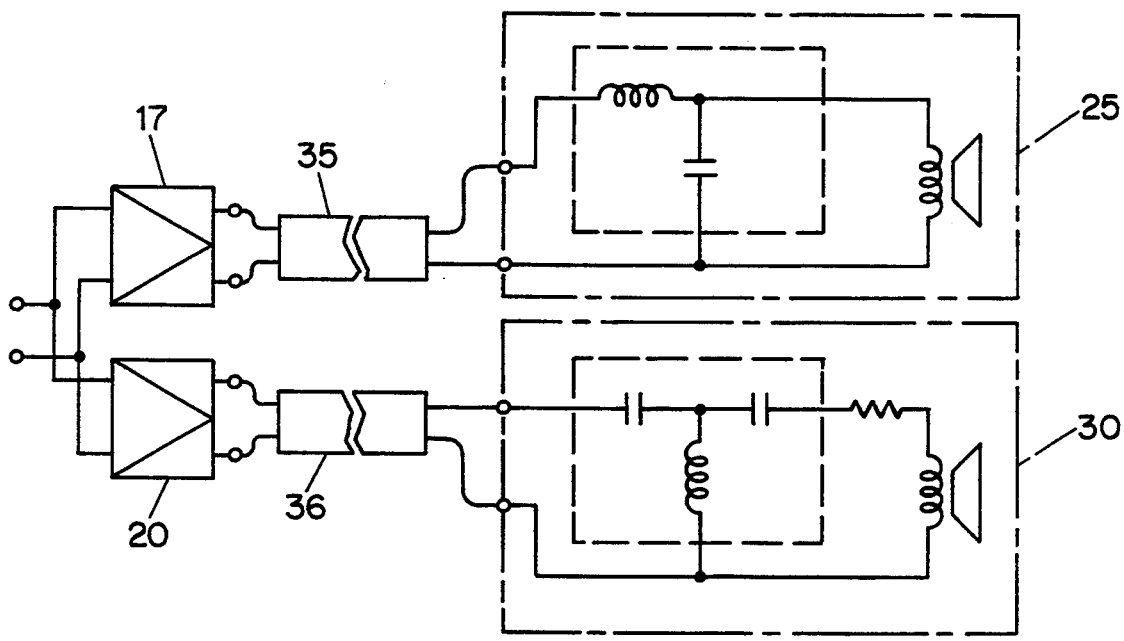
FIG. 3 is a schematic of a second type of prior art multi-way audio speaker amplification arrangement.
Figure 7:
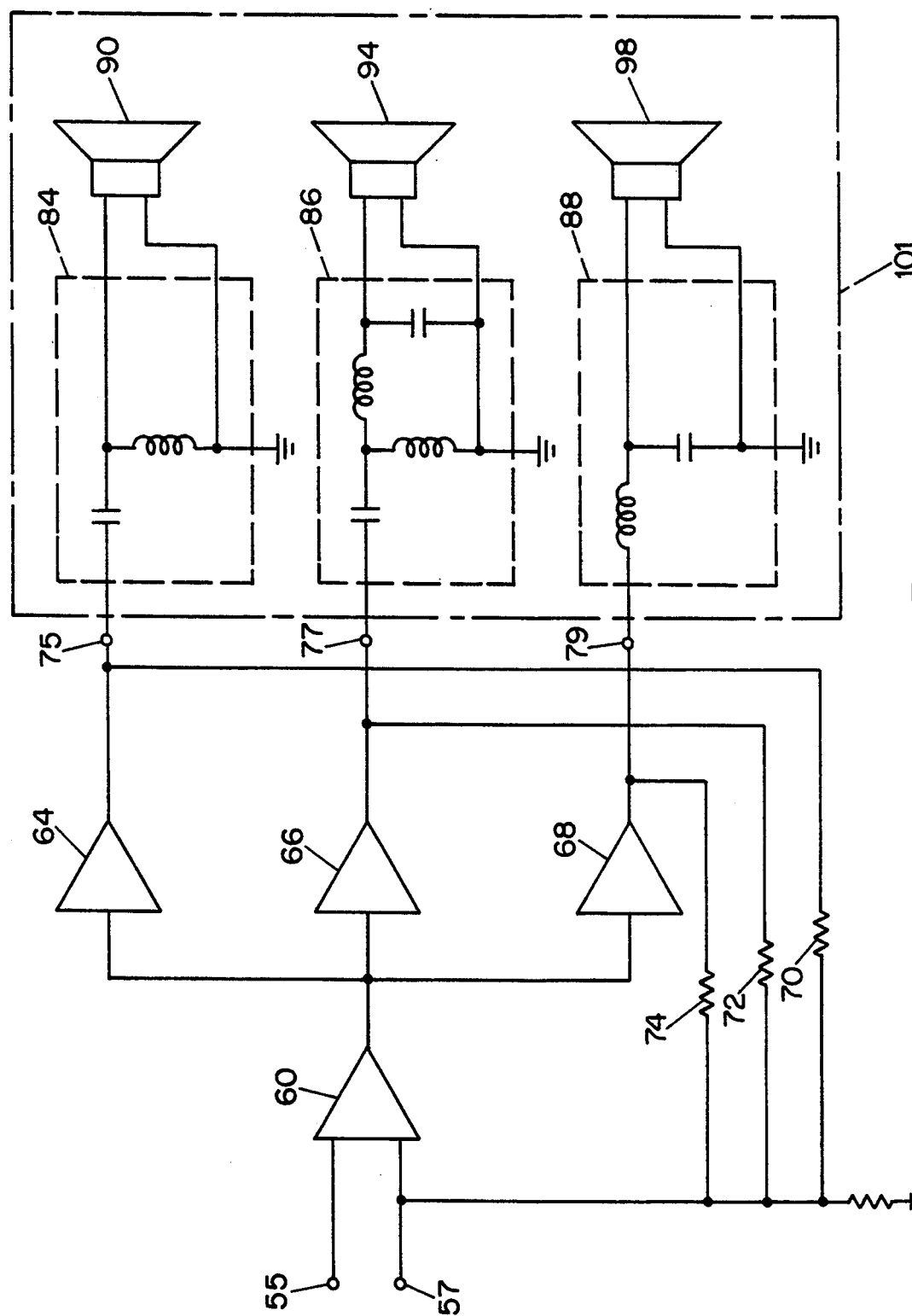
FIG. 7 is a schematic of the basic amplifier circuit connected in a three-way speaker.

FIG. 7 illustrates the multiple-output amplifier of FIG. 4 being used to drive a three-way speaker 101. The three-way speaker contains a high-frequency speaker component 90, a mid-frequency speaker component 94 and a low-frequency speaker component 98. Prior to entering a respective speaker component, the signal is filtered so that only the desired frequency range is passed to the speaker component. In FIG. 7, the signal at output terminal 75 is connected to the high-frequency speaker 90 through a high-pass filter 84. The signal at output terminal 77 is connected to the mid-frequency speaker 94 through a mid-frequency band-pass filter 86. The signal at output terminal 79 is connected to the low-frequency speaker 98 through a low-pass filter 88. By using the multiple-output amplifying device of the present invention, a greater degree of uniformity of input signal to each of the three speaker components is maintained than if either of the two prior art configurations of FIGS. 1 and 2 is used. This results in a higher quality of sound reproduction.

While the above is a description of the invention in its preferred embodiment, various modifications, alternate constructions and equivalents may be employed without departing from the spirit or scope of the invention as defined in the appended claims. For example any number of known voltage amplifiers or current amplifiers may be used to carry out the invention. Numerous feedback circuits may also be employed.

I claim:

1. An amplifying device comprising:
   (a) a first amplification stage comprising a voltage amplifier having an input and output;
   (b) a second amplification stage comprising a multiplicity of substantially identical current amplifiers each current amplifier having an input sharing a common connection to the output of the voltage amplifier, whereby each current amplifier receives substantially the same input signal and produces substantially the same output signal; and
   (c) a feedback circuit connecting the output of each current amplifier with the input of the voltage amplifier.

2. The amplifying device of claim 1 wherein the feedback circuit comprises a resistor.

3. The amplifying device of claim 2 wherein the feedback circuit further comprises a transistor connected between the output of at least one of the current amplifiers and the input of the voltage amplifier.

4. The amplifying device of claim 1 wherein the voltage amplifier comprises a differential voltage amplifier stage and an active-load amplification stage at the output of the differential voltage amplifier stage.

5. The amplifying device of claim 1 wherein each current amplifier is a two-stage push-pull current amplifier.

6. An amplifying device comprising:
   (a) a first amplification stage comprising a voltage amplifier having an input and output;
   (b) a second amplification stage comprising a multiplicity of substantially identical current amplifiers each current amplifier having an input sharing a common connection to the output of the voltage amplifier, whereby each current amplifier receives substantially the same input signal and produces substantially the same output signal;
   (c) a feedback circuit connecting the output of each current amplifier with the input of the voltage amplifier; and
   (d) a speaker component connected to the output of each current amplifier, each speaker component having a filter which passes a predetermined band of frequencies.

7. The multi-way speaker system of claim 6 wherein the feedback circuit comprises resistor.

8. The multi-way speaker system of claim 7 wherein the feedback circuit further comprises a transistor connected between the output of at least one of the current amplifiers and the input of the voltage amplifier.

* * * * *

UNITED STATES PATENT AND TRADEMARK OFFICE
CERTIFICATE OF CORRECTION

PATENT NO.  : 5,399,986
DATED       : March 21, 1995
INVENTOR(S) : Wailit Yen

It is certified that error appears in the above-indentified patent and that said Letters Patent is hereby corrected as shown below:

```
Title Page, Item 76, "77" should read --7--;
  "    "     "      "Japan" should read --Hong Kong--;
Col. 1, line 48, "output: load" should read --output load--;
Col. 2, line 67, "[11" should read --111--;
Col. 4, line 12, "amplifiers" should read --amplifiers,--;
Col. 4, line 38, "amplifiers" should read --amplifiers,--;
Col. 4, line 52, "comprises" should read --comprises a--.
```

Signed and Sealed this

Twentieth Day of June, 1995

Attest:

BRUCE LEHMAN

Attesting Officer    Commissioner of Patents and Trademarks